XR 3,537,854

CROSS REFERENCE

Nov. 3, 1970 A. W. GROBIN, JR., ET AL 3,537,854

HOLOGRAPHIC METHOD FOR GENERATING MASKING PATTERNS

Filed May 15, 1968

INVENTORS
ALLEN W. GROBIN, JR
JERRY L. REYNOLDS
RODMAN S. SCHOOLS
GLEN T. SINCERBOX

BY John F. Ostendorf
ATTORNEY

3537854
OR IN 96/36.2

United States Patent Office 3,537,854

Patented Nov. 3, 1970

3,537,854

HOLOGRAPHIC METHOD FOR GENERATING MASKING PATTERNS

Allen W. Grobin, Jr., Poughkeepsie, Jerry L. Reynolds, Wappingers Falls, Rodman S. Schools, Poughkeepsie, and Glenn T. Sincerbox, Wappingers Falls, N.Y., assignors to International Business Machines Corporation, Armonk, N.Y., a corporation of New York Filed May 15, 1968, Ser. No. 729,273
Int. Cl. G02b *27/00;* G03c *5/00*
U.S. Cl. 96—36.2 8 Claims

ABSTRACT OF THE DISCLOSURE

Masking patterns, such as utilized in fabricating integrated circuits, are generated utilizing the techniques of interference photography. A composite mask is fabricated having patterns of all the circuit sub-sets necessary for a particular circuit stored as interference patterns. Individual beams of radiation corresponding to respective ones of the stored patterns selectively interrogate the mask in sequence to form images on a semiconductor material. After each such image formation the semiconductor material is processed to provide the pattern sub-set in the material.

BACKGROUND OF THE INVENTION

Field of the invention

This invention relates to the generation of masking patterns and, more particularly, to the method utilizing the techniques of interference photography for forming the masking apparatus including the artwork employed in generating integrated circuits.

Description of the prior art

Conventionally integrated circuits are formed in semiconductor material using a plurality of masks or plates each containing an actual different circuit element or sub-set of elements in a particular arrangement. The individual masks are sequentially positioned over the semiconductor material having a photoresistive coating on it and illuminated. After each illumination the coating is developed and the opposite conductivity type semiconductor material is diffused into the original semiconductor material.

In this conventional process a plurality of individual masks must be generated by hand or machine. Photographic reduction of each mask is necessary. Defects and voids inherent in the material as well as defects due to foreign particles substantially reduce the efficiency of this artwork generation process. In forming the actual integrated circuit registration of each mask must be performed so as accurately to locate and position a given circuit element or sub-set on the semiconductor material.

SUMMARY OF THE INVENTION

As contrasted with this prior art method of forming integrated circuits using a plurality of individual masking patterns, the method of this invention provides for the generation of a single composite mask under computer control. Since the techniques of interference photography are employed, defects and void problems in the masks are eliminated as the composite mask is not affected by dust or foreign particles. The formation of a given pattern is redundant throughout the composite mask. Thus, it is not necessary to register and position each individual pattern for projecting the images of the elements or sub-sets of stored circuits to the semiconductor material.

In accordance with an aspect of the invention, a composite mask having all the masking patterns for a complete integrated circuit is formed by sequentially exposing representations from a library to a source of radiation. Each representation contains a single circuit element or sub-set of elements. Under computer control an image of a stored element or sub-set is projected to desired locations for interference at a photographic emulsion with a reference beam of radiation. Each projected element or sub-set has its own characterically different reference beam of radiation.

After processing the emulsion to form the composite mask, it is interrogated by beams of radiation selectively and in sequence to project images of the stored patterns on a semiconductor material having a photoresistive coating. After each image projection the coating and semiconductor material are processed to form the actual circuit sub-set in the material.

DESCRIPTION OF THE PREFERRED EMBODIMENT

Figure 1:
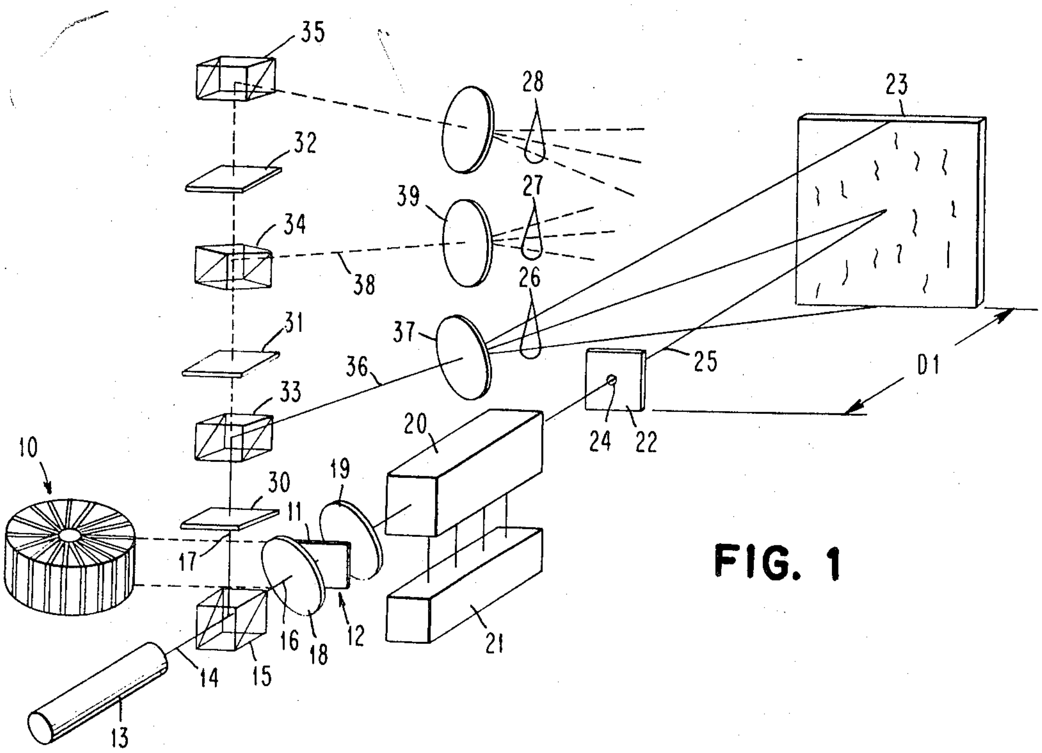
FIG. 1 is a schematic diagram in perspective of apparatus for forming a composite mask of interference patterns.

Referring now to FIG. 1, library 10 stores individual basic integrated circuit elements or sub-sets. These include emitters, base squares, isolation patterns, straight lines, etc. By appropriate apparatus, well known in the art, individual storage devices such as 11 are transported to a mask generating station 12 of the system.

The library may also take the form of a photographic tape or film which is sequentially passed through the mask generating station of the system. The tape would comprise a plurality of individual frames with each frame containing a particular element or sub-set.

The storage of the elements or sub-sets is preferably in the form of interference patterns, such as holograms, Lippmann holograms or Lippmann standing waves. A photographic representation of the actual element or sub-set could also be stored in the devices of library 10. However, storage as interference patterns eliminates the problem of registering and positioning each storage device or frame of the tape in the mask generating station. As storage by interference patterns is preferably in the form of a hologram, the storage devices will be referred to as such throughout the remainder of this description.

Hologram 11 positioned in mask generating station 12 is a Fourier transform hologram. It is position insensitive and therefore registration with respect to the elements of the generating system is not required. A source of radiation 13 such as a laser directs an unpolarized beam of light 14 at a beam splitter 15. Beam splitter 15 breaks beam 14 down into two polarized components 16, 17 in a manner well known in the art. One of the components 16 passes through lens 18, hologram 11 and lens 19 to a light deflector 20. Lenses 18 and 19 are each set one focal length from the hologram 11 so as to provide a real image transformation of the diffraction pattern stored in hologram 11 for positioning by light deflector 20.

Light deflector 20 is conventional in nature and acts under the control of electronic control circuits 21 to position the transformed image from hologram 11 at various locations in an image plane 22. Light deflectors for accomplishing this function are well known in the art. One such light deflector is described in application Ser. No. 285,832, filed June 5, 1962 in the names of Harris et al. and assigned to the same assignee as the invention. This application is now Pat. No. 3,499,700.

A diffuser may be positioned at image plane 22 spaced a distance D1 from a photographic plate 23. Plate 23 is a conventional photo-emulsion. One such emulsion plate which may be utilized is that available as EK649F plates. Such an emulsion plate provides high resolution in recording interference patterns.

Deflector 20 responds to the control signals from circuits 21, which may be activated in accordance with a computer program, to position the image of the element or sub-set stored in hologram 11 at various locations on the diffuser plate positioned in the image plane 22. By way of illustration, if it is assumed that hologram 11 stores a transistor base configuration 24, the configuration can be deflected to as many different positions in plane 22 as desired during a single exposure period to form a particular image pattern. The position of the deflector output is altered at a rate of speed greater than 100 cycles per second by applying appropriate voltages from control circuits 21 to the control elements of deflector 20, to form a desired pattern for that element. The formed pattern of the particular circuit element or sub-set is projected from plane 22 to emulsion 23 as beam 25 for interference with a second beam of radiation 26 as hereinafter described.

The second beam of radiation 26 is derived from component 17 provided from beam splitter 15. It is readily apparent that beam 26 may also be provided by a separate and independent radiation source. As already described, when unpolarized light beam 14 is directed to beam splitter 15 one component is transmitted through beam splitter 15 for interrogating hologram 11 as beam 16. The other component is reflected upwardly as beam 17 to be used in forming the reference beams necessary for generating the composite masking pattern in photographic plate 23. Beam 17 is utilized to expose plate 23 at various angles (one at a time) allowing several individual masks, one for each array pattern of elements or sub-sets to be generated in plate 23.

For selecting the particular angle of iniidence of a reference beam a plurality of polarizers 30, 31, 32 and beam splitters 33, 34, 35 are positioned in the path of beam 17. The polarizers may be electro-optic crystals such as potassium diduterium phosphate (KD*P) crystals having transparent electrodes on the faces thereof. When a voltage is not applied across the polarizer no change is effected in the polarization of the beam incident on it. When the half-wavelength voltage for the particular crystal polarizer is applied to the electrodes a 90° change in the polarization of beam 17 is accomplished. Dependent on the orientation of the beam splitter following the polarizer, the beam is reflected in a substantially horizontal path from the beam splitter 33 or is passed through the beam splitter to the next polarizer. By suitably arranging beam splitters 33–35 and by selectively activating polarizers 30–32 in a manner well known in the art, anyone of the reference beams 26, 27, 28 may be obtained.

To form the masking pattern of the element or sub-set projected from hologram 11 as an interference pattern in plate 23, beam 36 is provided by beam splitter 33 to lens 37. Reference beam 26 having a radius of curvature R1 is directed at plate 23 to form the interference pattern with beam 25.

After exposure of hologram 11 a second hologram containing the interference pattern for another element or sub-set from library 10 is transported to generating station 12. It is similarly projected in a desired pattern on the diffuser plate at image plane 22 for projection to plate 23. A second reference beam 27 having a different angle of incidence with respect to plate 23 from beam 26 is generated from beam 38 supplied to lens 39 from beam splitter 34.

This process is repeated to form the composite hologram in plate 23 by replacing the holograms from library 10 in the generating station. Each time light deflector 20 generates a pattern of an element or sub-set at image plane 22. Concurrently, a reference beam is provided by the arrangement of polarizers 30–32 and beam splitters 33–35. The image patterns interfere with the different reference beams at plate 23.

Although the composite hologram has been described as being formed in plate 23 by selectively and sequentially generating patterns for storage, the composite hologram may also be formed by simultaneous exposure of plate 23 to a plurality of required circuit elements or sub-sets. Each circuit element or sub-set would interfere with its own reference beam. In such a case individual projecting and light deflecting systems would be required for each sub-set.

Similarly, the plate 23 may also form a composite masking pattern using Lippmann holographic recording techniques. In this technique, the reference beam would be supplied from the opposite side of plate 23. This could be accomplished using the same source of radiation 13 by employing suitable optical directing elements to cause incidence of the reference beam from the opposite side of the emulsion or a separate source of radiation could be utilized with an arrangement of polarizers and beam splitters.

After exposure of photographic plate 23 to form the composite masking pattern, the plate is processed using conventional photographic processing procedures to form the composite hologram. It now contains all the necessary masks for a complete integrated circuit. Instead of the actual patterns of the masks being stored, interference patterns of these masks are stored. The storage is redundant through the entire hologram. The various elements or sub-sets for the particular integrated circuit are positioned in depth in the plate and at various locations across the face of it.

Figure 2:
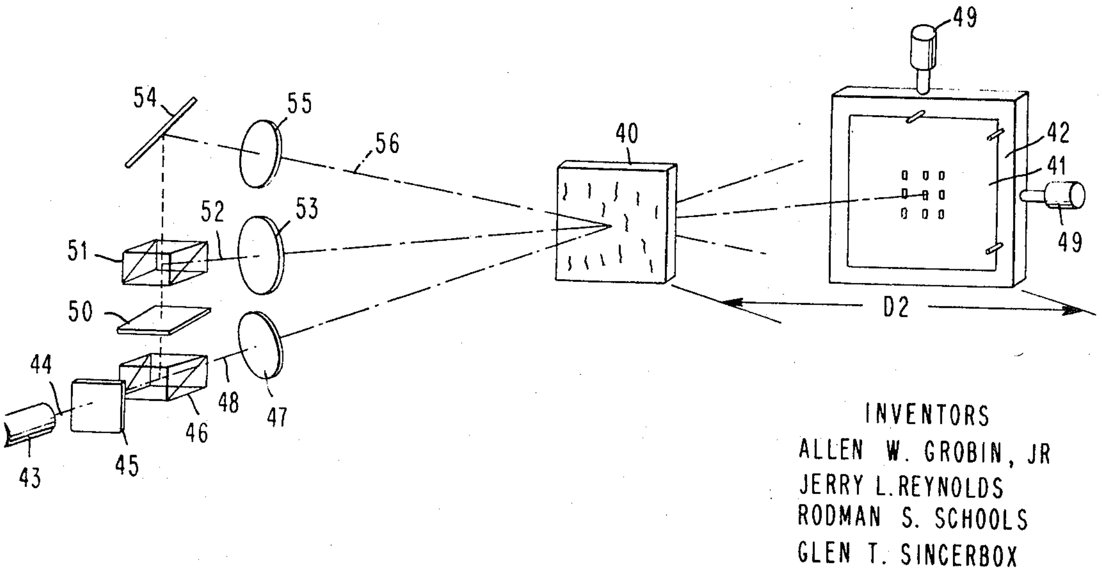
FIG. 2 is a schematic diagram in perspective of apparatus for projecting images of the patterns stored in the composite mask formed in the apparatus of FIG. 1 to form an integrated circuit.

To describe the method of generating the actual integrated circuit, reference is made to FIG. 2. The processed hologram 40 is placed in a read station, in line with a semiconductor wafer chip 41 held in holder 42 having position adjusting elements 49. The surface of chip 41 is coated with a photoresistive material. This surface of chip 41 is exposed to the image projected from hologram 40. The individual patterns stored in hologram 40 are projected to the photosensitive surface of chip 41 by independent interrogating beams of radiation. The beams of radiation may be supplied by individual sources of radiation or they may be supplied in a manner such as described in connection with the formation of the reference beams in the apparatus of FIG. 1. Thus, source of radiation 43, which may be a laser, provides beam 44 which is passed to polarizer 45 and beam splitter 46. Dependent on the polarization of the beam emitted by polarizer 45 it passes to lens 47 as beam 48 or is reflected to polarizer 50 as described above in connection with the formation of the reference beams in FIG. 1.

Beam 48 is incident on hologram 40 to expose a first mask pattern contained in hologram 40. The angle of incidence of beam 48 on hologram 40 corresponds to the angle of incidence of one reference beam on plate 23 in FIG. 1 such as beam 26 is recording the particular pattern that is formed from hologram 11. The selected pattern is projected on the photosensitive surface on the face of chip 41.

After the photosensitive surface formed on chip 41 is exposed to a mask pattern, the chip can be removed for processing by developing the photoresistive material. Thereafter, the appropriate semiconductor material is diffused into the semiconductor chip. Alternatively, the process can be accomplished by positioning the chip in a diffusion chamber and having the radiation projected through an optical window in this chamber. After each processing of the semiconductor chip a new coating of photoresistive material is applied to the face of the chip.

If it is necessary to remove the semiconductor chip for processing, registration of the chip in the path of the patterns projected from hologram 40 may be accomplished by exposing a grating on the substrate directly.

The photosensitive material would then be developed and the grating could be used as a position register vernier. This method of registration is described more particularly in application Ser. No. 608,809, filed Jan. 12, 1967 in the names of Duda et al. and assigned to the same assignee as this invention.

An alternate method of registration would be to direct radiation from a longer wavelength source of radiation on the previously exposed mask. The longer wavelength radiation does not expose the photoresistive surface of the chip, but does place a magnified image on the chip. The magnified image is then employed as a register mask or as a vernier for fine positioning. At this time the source of radiation of shorter wavelength used in the exposure process is turned off.

After each processing of the semiconductor material another masking pattern is exposed on chip 41 by suitably activating polarizers 45 and 50 to rotate the polarization of the beam provided by source 43 for reflection in beam splitters 46 and 51. Beam 52 is reflected from beam splitter 51 through lens 53 to interrogate hologram 40 to project the second masking pattern for exposure on chip 41. Similarly, after the processing of the second pattern, a third masking pattern is projected by suitably activating the polarizers to direct the beam to a mirror 54 through lens 55 as beam 56. The radiation beam in each interrogation has an angle of incidence on hologram 40 corresponding to the angle of incidence of a reference beam used in FIG. 1. Thus, the angle of incidence of the interrogating beam for a specific pattern is the same as the angle of incidence of the reference beam used in forming that pattern.

It is to be understood that the semiconductor processes involved in the description of this invention do not constitute a part of this invention as they are well known in the art. The invention of this application is directed to the formation of a composite mask containing patterns of all the elements or sub-sets required for a particular integrated circuit. The invention is also directed to the subsequent projection from this composite mask of the various patterns on a photosensitive surface covering the semiconductor material. In like manner, it is to be understood that the semiconductor material may be monolithic in nature and formed of a single semiconductor substrate or it may be of the hybrid type including a plurality of semiconductor surfaces joined together. The semiconductor processes are conventional and reference may be had to the text, "Analysis and Design of Integrated Circuits" edited by Lynn et al., McGraw-Hill Publishing Company, 1967, for a more complete description of these processes.

Thus far the projection of the stored patterns from hologram 40 has been described as taking place with a 1:1 magnification ratio. It is to be understood that the invention is not that limited. Thus, the radium of curvature of the beam from lens 47 to hologram 40 is R2 and the distance from hologram 40 to chip 41 is D2. The lateral magnification of the reconstructed image at chip 41 is given by:

$$M=\left(1-\frac{D1}{R1}+\frac{\lambda 1 D1}{\lambda 2 R2}\right)^{-1}$$

D1 is the distance of the image plane 22 to the plate 23 in the mask fabrication apparatus of FIG. 1. — is for the real image, and + is for the virtual image. λ1 is the wavelength of the radiation used in the fabrication process and λ2 is the wavelength of the radiation in the reconstruction process. R1 is the radius of curvature of the reference generating beam.

Three distinct cases for demagnified reconstruction of the mask are possible. Thus, if it is desired to reconstruct the mask at unit magnification and demagnify either the real or virtual images with conventional optics, the hologram 40 is utilized as a flawless mask and the following conditions are satisfied:

$$R1=\pm R2 \text{ and } \lambda 1=\lambda 2$$

Secondly, where + is for the virtual image and — is for the real image, the actual (virtual) image can be reconstructed with a pattern demagnification from hologram 40 if either or both of the following relationships are satisfied:

$$\lambda 2<\lambda 1 \text{ and/or } R2<R1$$

The image from hologram 40 is then projected without conventional optics to the semiconductor material.

A third case provides for the reconstruction of the real image from hologram 40 at a desired demagnification. This is accomplished, for example, by employing a ference beam having a wavefront of one shape during the fabrication of the masking pattern and by employing an interrogating beam having a different wavefront for reconstruction. Thus, the reference beam could have a parallel wavefront and the interrogating beam a spherical wavefront. The reconstructed image is then projected directly for exposure of the photoresistive surface on the semiconductor material.

Using the method of this invention the composite mask that is generated is insensitive to dust, scratches or foreign particles. Each individual mask needed in the fabrication of a single integrated circuit is stored in a single composite mask. This arrangement also permits greater resolution to be obtained than that ordinarily obtained through the use of a light deflector. The light deflector ordinarily has a resolution in the order of 10 to 20 microns. This resolution may be increased by making the hologram with a wavelength of radiation that is greater than the wavelength of radiation employed in the reconstruction of the images from the hologram.

The reference beam employed in the fabrication process and the interrogation beam utilized in the reconstruction processes have been described as being incident at different angles on the plate 23 in the fabrication process and the hologram 40 in the reconstruction process. This provides a characteristic difference that is a positional difference of one with respect to all others. It is to be understood that multiple storage can be obtained in other ways. Thus, it is possible to maintain a constant difference between reference and signal beams, and produce multiple storage by rotating the storage medium between exposures. Moreover, in the case of Lippmann holography, it is also possible to use a different frequency reference beam or interrogating beam to render each reference beam different from all others.

While the invention has been particularly shown and described with reference to the preferred embodiment thereof, it will be understood by those skilled in the art that the foregoing and other changes in form and details may be made therein without departing from the spirit and scope of the invention.

What is claimed is:

1. In a method of fabricating an integrated circuit on a semiconductor substrate in which a series of masking patterns is sequentially projected onto the surface of said semiconductor substrate from a composite mask, the improvement comprising the steps of:

projecting a beam of linearly polarized coherent light sequentially and individually through selected Fourier transform holograms selected from a library of such holograms of specific semiconductor circuit elements and circuit subsets to form an image for each projection at the input to a light deflector, said Fourier transform hologram providing registration invariance for the selected element or subset at the input to said deflector, deflecting by means of said deflector each said image to selected locations on a screen to form a pattern, concurrently producing for each pattern a selected one of a plurality of characteristically differing coherent reference light beams, and directing said selected reference beam to intersect light emanating from the pattern formed on the screen at a plane, placing a recording medium at said plane to receive the light from each pattern formed on the screen and the light from the corresponding selected reference beam so as to form a composite hologram mask having a plurality of incoherently superimposed interference patterns formed coextensively in the same volume in said medium from all of the patterns formed on said screen.

2. In the method of claim 1, further comprising the steps of:

splitting a beam of unpolarized light into the projecting beam and another beam of linearly polarized light, directing said other beam along one of a pluralty of paths dependent on its polarization, selectively altering the polarization of the other beam to provide the selected reference beam along one of said paths.

3. In the method of claim 1, further comprising the steps of:

projecting images of the masking patterns on said semiconductor by selectively and sequentially interrogating the recording medium with selected ones of said plurality of characteristically differing light beams, and processing the regions of said semiconductor where an image is formed after each image selection to provide the selected sub-set in the semiconductor.

4. In the method of claim 1, further comprising the steps of:

projecting images of the masking patterns by selectively and sequentially interrogating the recording medium with selected ones of a plurality of characteristically differing light beams, exposing the semiconductor having photoresponsive means thereon to the projected images, developing the regions of the photoresponsive means after each image projection, and processing the developed regions after each image projection to provide the selected sub-set in the semiconductor.

5. In the method of claim 4 in which images of the masking patterns are reconstructed at unit magnification by employing reference beams in forming the masking patterns having radii of curvature R1 and wavelengths $\lambda 1$ and the interrogating beams employed have radii of curvature R2 and wavelengths $\lambda 2$, wherein $R1=R2$ and $\lambda 1 \simeq \lambda 2$ and wherein the reconstructed unit magnified images are projected in demagnified form with optical means.

6. In the method of claim 4 in which the images of the masking patterns are reconstructed with demagnification at the semiconductor by employing reference beams in forming the masking patterns having radii of curvature R1 and the interrogating beams employed have radii of curvature R2 and wherein $R2<R1$.

7. In the method of claim 4 in which the images of the masking patterns are reconstructed with demagnification at the semiconductor by employing reference beams in forming the masking patterns having wavelengths $\lambda 1$ and the interrogating beams employed have wavelengths $\lambda 2$ and wherein $\lambda 2<\lambda 1$.

8. In the method of claim 4 in which the images of the masking patterns are reconstructed with demagnification at the semiconductor by employing reference beams in forming the masking patterns having a wavefront of a first shape and interrogating beams having a wavefront of a second shape.

References Cited

UNITED STATES PATENTS 3,264,105 8/1966 Houtz .............. 96—36.2

OTHER REFERENCES

Meier: Jour. of Optical Soc. of Am., vol. 55, No. 8, August 1965, pp. 987–992.

Gabor: Nature, vol. 208, No. 5009, October 1965, pp. 422–423.

Vitols: IBM Technical Disclosure Bull., vol. 8, No. 11, April 1966, pp. 1581–3.

Erdos: ibid., vol. 9, No. 3, August 1966, p. 291.

Field: Electronic Design, vol. 14, June 21, 1966, pp. 17–18.

Van Ligten et al.: Jour. of Applied Physics, vol. 38, March 1967, pp. 1994–1996.

DAVID SCHONBERG, Primary Examiner

R. J. STERN, Assistant Examiner

U.S. Cl. X.R.

96—27; 305—3.5